US012719410B2

(12) United States Patent
Hu

(10) Patent No.: US 12,719,410 B2
(45) Date of Patent: Aug. 25, 2026

(54) DIGITAL SIGNAL COMPENSATION

(71) Applicant: Telefonaktiebolaget LM Ericsson (publ), Stockholm (SE)

(72) Inventor: Weixuan Hu, Beijing (CN)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 397 days.

(21) Appl. No.: 18/285,906

(22) PCT Filed: Jul. 20, 2021

(86) PCT No.: PCT/CN2021/107235
§ 371 (c)(1),
(2) Date: Oct. 6, 2023

(87) PCT Pub. No.: WO2022/213510
PCT Pub. Date: Oct. 13, 2022

(65) Prior Publication Data
US 2024/0313710 A1 Sep. 19, 2024

(30) Foreign Application Priority Data
Apr. 9, 2021 (WO) ................ PCT/CN2021/086132

(51) Int. Cl.
*H03F 1/32* (2006.01)
*H03F 1/02* (2006.01)
*H03F 3/24* (2006.01)

(52) U.S. Cl.
CPC ......... *H03F 1/0205* (2013.01); *H03F 1/3247* (2013.01); *H03F 3/245* (2013.01); *H03F 2200/451* (2013.01)

(58) Field of Classification Search
CPC .................................... H03F 1/32; H03G 3/20
(Continued)

(56) References Cited

U.S. PATENT DOCUMENTS 6,054,894 A * 4/2000 Wright .................. H03F 1/3247 330/149
6,714,073 B2 * 3/2004 Suto ...................... H03F 1/3247 330/136
(Continued)

FOREIGN PATENT DOCUMENTS

EP 1203445 B1 9/2004

OTHER PUBLICATIONS

International Search Report and Written Opinion of the International Searching Authority, PCT/CN2021/107235, mailed Jan. 6, 2022, 10 pages.
(Continued)

*Primary Examiner* — Henry Choe
(74) *Attorney, Agent, or Firm* — Sage Patent Group

(57) ABSTRACT

The present disclosure provides a method and device for digital signal compensation. The method for signal compensation includes: generating a digital compensation signal at least partially based on smoothing, in real time, a digital input signal or a signal that is derived from the digital input signal; delaying the digital input signal such that the delayed digital input signal is aligned with the digital compensation signal in the time domain; and generating a digital compensated signal by combining the delayed digital input signal with the digital compensation signal.

18 Claims, 12 Drawing Sheets

(58) Field of Classification Search
USPC .................................................. 330/149, 136
See application file for complete search history.

(56) References Cited

U.S. PATENT DOCUMENTS

| | | | | |
|---|---|---|---|---|
| 6,798,843 | B1 | 9/2004 | Wright et al. | |
| 2005/0001684 | A1 | 1/2005 | Braithwaite | |
| 2005/0190857 | A1 | 9/2005 | Braithwaite | |
| 2010/0304694 | A1 | 12/2010 | Suzuki et al. | |
| 2012/0224654 | A1 | 9/2012 | Nagatani et al. | |
| 2014/0191799 | A1* | 7/2014 | Ohkawara ................. | H03F 3/19 330/149 |
| 2016/0164466 | A1* | 6/2016 | Briffa ........................ | H03F 3/24 330/295 |
| 2016/0191020 | A1 | 6/2016 | Velaquez | |

OTHER PUBLICATIONS

Mccann, Damian et al., “Improving upon Pulse-to-Pulse stability in GaN RADA amplifiers compromised by the presence of GaN trapping effects,” Proceedings of the 45th European Microwave Conference, Sep. 7-10, 2015, Paris, France, 4 pages.

International Search Report and Written Opinion of the International Searching Authority, PCT/CN2021/086132, mailed Sep. 21, 2021, 14 pages.

Extended European Search Report, European Patent Application No. 21935730.8, mailed Nov. 12, 2024, 13 pages.

* cited by examiner

Before DTC

After DTC

Before DTC

After DTC

Carrier #1, After DTC

Carrier #2, After DTC

Carrier #3, After DTC

DIGITAL SIGNAL COMPENSATION

CROSS-REFERENCE TO RELATED APPLICATIONS

This application is a 35 U.S.C. § 371 national stage application of PCT International Application No. PCT/CN2021/107235 filed on Jul. 20, 2021, which in turn claims priority to the PCT International Application No. PCT/CN2021/086132, filed on Apr. 9, 2021, which are incorporated herein by reference in their entirety.

TECHNICAL FIELD

The present disclosure is related to the field of electronic device, and in particular, to a method and device for digital signal compensation.

BACKGROUND

This section introduces aspects that may facilitate better understanding of the disclosure. Accordingly, the statements of this section are to be read in this light and are not to be understood as admissions about what is in the prior art or what is not in the prior art.

GaN Power Amplifiers (PAS) have advantages in high power efficiency and loose thermal sink requirement, and are expected to be widely used. One of GaN's disadvantages, however, is the so-called trapping effect. The trapping effect is generally resulted from presence of impurities or defects in a crystalline material, which are heavily related to the GaN's epitaxial growth and surface treatment process. Electrically active crystal defects can trap electrons, leading to a fast capture (voltage driven) and slow release (thermal driven) during Radio Frequency (RF) stimuli. The capture rate is proportional to availability of electrons and empty traps and the release requires (thermal) energy.

The trapping effects have impacts on the GaN's performance in various aspects. Buffer traps (below the gate metal) result in a shift in a threshold voltage, which can be observed in Drain-Source current ($I_{DS}$)-Gate-Source voltage ($V_{GS}$) characteristics, and also result in kink effect in $I_{DS}$-$V_{GS}$ characteristics and $I_{DS}$-Drain-Source voltage ($V_{DS}$) characteristics. Gate-Source Surface (GSS) traps result in a shift in a peak trans-conductance, by modification of source resistance ($R_S$), which could be observed in $I_{DS}$-$V_{GS}$ characteristics, and also result in a kink effect in $I_{DS}$-$V_{GS}$ characteristics. Gate-Drain Surface (GDS) traps result in a shift in a knee of $I_{DS}$-$V_{DS}$ characteristics by modification of Drain-Source resistance ($R_{DS}$), and also a kink effect in $I_{DS}$-$V_{DS}$ characteristics. Surface traps are considered as the main reason for current collapse.

The trapping effect will impact a gain and a phase response of a GaN PA. In order to solve this problem, a GaN booster solution can be used. At different temperature levels, a back-off value of a Peak PA and an $I_{DS}$ of a Main PA can be adjusted to generate a temperature compensation table (TCT) for the booster. While a lower back-off value of the Peak PA and a higher $I_{DS}$ of the Main PA can decrease the trapping effect, the power efficiency will be significantly degraded. Moreover, it may cost too much time to obtain the bias TCT for the GaN booster, which is inefficient.

There are some other solutions that have been proposed, which typically requires an additional circuit, such as a Diode based Phase Modulator circuit, as a pre-correction circuit, to pre-correct the gain and phase offset. However, such solutions have increased costs, and their performance gets worse for dynamic waveforms having small signals and large signals, e.g., for Long Term Evolution (LTE) tm2a test sequence.

SUMMARY

According to a first aspect of the present disclosure, a method for signal compensation is provided. The method comprises: generating a digital compensation signal at least partially based on smoothing, in real time, a digital input signal or a signal that is derived from the digital input signal; delaying the digital input signal such that the delayed digital input signal is aligned with the digital compensation signal in the time domain; and generating a digital compensated signal by combining the delayed digital input signal with the digital compensation signal.

In some embodiments, the step of generating a digital compensation signal comprises: generating a first processed signal at least partially based on smoothing, in real time, the digital input signal or the signal that is derived from the digital input signal; and generating the digital compensation signal at least partially based on the first processed signal. In some embodiments, the step of generating a first processed signal at least partially based on smoothing, in real time, the digital input signal or the signal that is derived from the digital input signal comprises: generating a first power signal from the digital input signal; and generating the first processed signal by smoothing the first power signal in real time. In some embodiments, the step of generating a first processed signal at least partially based on smoothing, in real time, the digital input signal or the signal that is derived from the digital input signal comprises: generating a smoothed signal by smoothing the digital input signal in real time; and generating, as the first processed signal, a first power signal from the smoothed signal.

In some embodiments, the first power signal is generated as follows:

$$\text{power}(k) = I^2(k) + Q^2(k)$$

where I(k) and Q(k) are in-phase and quadrature components of the $k^{th}$ sample of the digital input signal or the smoothed signal in an updating period, respectively.

In some embodiments, the smoothing is performed by a low pass filter that has a cut-off frequency such that a smoothed large signal can be distinguished from a smoothed small signal. In some embodiments, the step of generating a digital compensation signal comprises: determining one of multiple power ranges corresponding to the first processed signal; and generating a digital compensation signal corresponding to the determined power range. In some embodiments, the step of determining one of multiple power ranges corresponding to the first processed signal comprises: comparing the first processed signal with one or more thresholds by which the multiple power ranges are defined; and determining the power range corresponding to the first processed signal based on a result of the comparison. In some embodiments, the step of generating a digital compensation signal corresponding to the determined power range comprises: using the determined power range as an index into a lookup table (LUT) to retrieve a corresponding entry from the LUT; and generating the digital compensation signal based on the retrieved entry. In some embodiments, the initial values of the entries of the LUT are 1.

In some embodiments, the step of generating a digital compensated signal by combining the delayed digital input signal with the digital compensation signal comprises: generating the digital compensated signal by multiplying the delayed digital input signal with the digital compensation signal. In some embodiments, the method further comprises: adaptively updating at least one value, from which at least one corresponding compensation signal is generated, based on one or more digital input signals and one or more corresponding digital compensated signals that are amplified. In some embodiments, the one or more corresponding digital compensated signals that are amplified are one or more digital transmitter observation receiver (TOR) signals.

In some embodiments, the step of adaptively updating at least one value comprises: selecting a set of digital input signals from the one or more digital input signals based on a flatness of each of the one or more digital input signals; and adaptively updating at least one value at least partially based on the set of the digital input signals, wherein a flatness of a signal indicates whether the signal has a change in power greater than or equal to a threshold or not.

In some embodiments, the step of selecting a set of digital input signals from the one or more digital input signals based on a flatness of each of the one or more digital input signals comprises: selecting the set of the digital input signals by filtering out any digital input signal having a flatness greater than or equal to the threshold from the one or more digital input signals. In some embodiments, the flatness is a peak-to-average-ratio (PAR) or a standard deviation of power of multiple samples of the digital input signal. In some embodiments, the step of adaptively updating at least one value comprises: aligning one or more digital input signals that are input during an updating period and their corresponding digital TOR signals in the time domain, respectively; normalizing the one or more digital input signals and their corresponding digital TOR signals; for each set of digital input signals that are input during the updating period and that are associated with a same power range, calculating an offset based on the corresponding set of digital input signals and the corresponding digital TOR signals that are aligned in the time domain and normalized; for the each set of digital input signals that are input during the updating period and that are associated with the same power range, calculating a corresponding weight based on a corresponding offset; and updating the at least one value based on the calculated weights.

In some embodiments, an offset is calculated as follows:

$$OST_{current}(\text{index}) = \frac{\sum_{k=0}^{L-1} |Tx(k)|^2}{\sum_{k=0}^{L-1} Tor(k).*conj(Tx(k))}$$

where index is the index of a corresponding entry of the LUT, $OST_{current}$(index) is the offset for the corresponding entry in the current updating period, Tor(k) is the $k^{th}$ sample data of the digital TOR signal in the current updating period, Tx(k) is the $k^{th}$ sample data of the digital input signal in the current updating period, L is the number of sample data sampled in an updating period, "·*" is an operator for calculating a dot product of its operands, and conj(·) is an operator for calculating a conjugate of its operand.

In some embodiments, a weight is calculated as follows:

$$W_{new}(\text{index}) = W_{current}(\text{index}) * (1-\alpha) + OST_{current}(\text{index}) * \alpha$$

where $W_{current}$(index) is the weight for the corresponding entry in the current updating period, $W_{new}$(index) is the weight calculated for updating the corresponding entry, and $\alpha$ is a constant.

In some embodiments, the LUT is updated as follows:

$$LUT_{new}(\text{index}) = LUT_{current}(\text{index}) * W_{current}(\text{index}),$$

$$\text{index} = 0, 1, 2 \ldots Dep - 1$$

where $LUT_{current}$(index) is the corresponding entry of the LUT in the current updating period, $LUT_{new}$(index) is the calculated entry that will replace $LUT_{current}$(index) for updating, and Dep is the number of entries of the LUT.

In some embodiments, the updating period is on the order of milliseconds. In some embodiments, the initial values of the weights are 1.

According to a second aspect of the present disclosure, a device for signal compensation is provided. The device comprises: a processor; and a memory having instructions stored thereon which, when executed by the processor, cause the processor to perform a method of any of the first aspect.

According to a third aspect of the present disclosure, a power amplifier is provided. The power amplifier comprises: a device of the second aspect; a digital to RF converter configured to convert a digital compensated signal into a compensated RF signal; and a GaN power amplifier configured to amplify the compensated RF signal for radio transmission.

According to a fourth aspect of the present disclosure, a computer program comprising instructions is provided. The instructions, when executed by at least one processor, cause the at least one processor to carry out the method of any of the first aspect.

According to a fifth aspect of the present disclosure, a carrier containing the computer program of the fourth aspect. In some embodiments, the carrier is one of an electronic signal, optical signal, radio signal, or computer readable storage medium.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and therefore are not to be considered limiting of its scope, the disclosure will be described with additional specificity and detail through use of the accompanying drawings.

DETAILED DESCRIPTION

Figure 1:
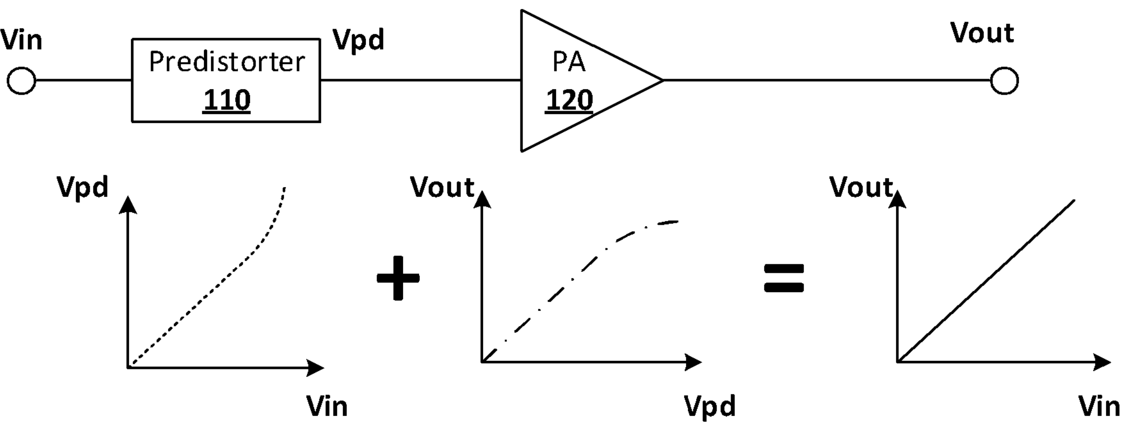
FIG. 1 is a diagram illustrating an exemplary circuit for power amplifying with DPD enabled in which a method for digital signal compensation according to an embodiment of the present disclosure may be applicable.

Hereinafter, the present disclosure is described with reference to embodiments shown in the attached drawings. However, it is to be understood that those descriptions are just provided for illustrative purpose, rather than limiting the present disclosure. Further, in the following, descriptions of known structures and techniques are omitted so as not to unnecessarily obscure the concept of the present disclosure.

Those skilled in the art will appreciate that the term "exemplary" is used herein to mean "illustrative," or "serving as an example," and is not intended to imply that a particular embodiment is preferred over another or that a particular feature is essential. Likewise, the terms "first" and "second," and similar terms, are used simply to distinguish one particular instance of an item or feature from another, and do not indicate a particular order or arrangement, unless the context clearly indicates otherwise. Further, the term "step," as used herein, is meant to be synonymous with "operation" or "action." Any description herein of a sequence of steps does not imply that these operations must be carried out in a particular order, or even that these operations are carried out in any order at all, unless the context or the details of the described operation clearly indicates otherwise.

The terminology used herein is for the purpose of describing particular embodiments only and is not intended to be liming of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof. It will be also understood that the terms "connect (s)," "connecting", "connected", etc. when used herein, just means that there is an electrical or communicative connection between two elements and they can be connected either directly or indirectly, unless explicitly stated to the contrary.

Conditional language used herein, such as "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without input or prompting, whether these features, elements and/or states are included or are to be performed in any particular embodiment. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below. In addition, language such as the phrase "at least one of X, Y and Z," unless specifically stated otherwise, is to be understood with the context as used in general to convey that an item, term, etc. may be either X, Y, or Z, or a combination thereof.

Of course, the present disclosure may be carried out in other specific ways than those herein set forth without departing from the scope and essential characteristics of the invention. One or more of the specific processes discussed below may be carried out in any communications transceiver comprising one or more appropriately configured processing circuits, which may in some embodiments be embodied in one or more application-specific integrated circuits (ASICs). In some embodiments, these processing circuits may comprise one or more microprocessors, microcontrollers, and/or digital signal processors (DSPs) programmed with appropriate software and/or firmware to carry out one or more of the operations described above, or variants thereof. In some embodiments, these processing circuits may comprise customized hardware to carry out one or more of the functions described above. The present embodiments are, therefore, to be considered in all respects as illustrative and not restrictive.

Although multiple embodiments of the present disclosure will be illustrated in the accompanying Drawings and described in the following Detailed Description, it should be understood that the invention is not limited to the disclosed embodiments, but instead is also capable of numerous rearrangements, modifications, and substitutions without departing from the present disclosure that as will be set forth and defined within the claims.

Further, please note that although the following description of some embodiments of the present disclosure is given in the context of GaN power amplifier, the present disclosure is not limited thereto. In some other embodiments, the signal compensation devices described herein may be used in any application which requires digital signal compensation.

Long Term Evolution (LTE) and New Radio (NR) networks and signals present a range of problems for the Radio Frequency (RF) front end in handsets and base stations as the signal characteristics differ greatly from previous 2G and 3G standards. Key metrics such as battery life, antenna performance, network coverage, and thermal management are negatively affected by issues in the RF front end. Central to these challenges is the RF power amplifier (PA), its performance, and power consumption.

Some chipset companies are considering a signal processing technique, Digital PreDistortion (DPD), as a way to optimize PA performance. DPD is a linearization technique. In an RF PA, there are several types of distortion which need to be considered and controlled. Amplifier distortion products falling within the bandwidth of the signal being transmitted will degrade the Error Vector Magnitude (EVM) of the signal at the receiver, reducing coverage and data rate. Higher frequency distortion products outside the transmit channel may cause interference to other users in neighboring channels, and are usually constrained by Adjacent Channel Leakage Ratio (ACLR) regulatory specifications. For Frequency Division Duplex (FDD) systems, such as FD-LTE, distortion from the PA which spreads from the transmit band into the receive band can also degrade the sensitivity of the handset's receiver, despite attenuation from the duplex filter—with more than 40 bands in use for LTE and NR, this requires analysis of many different frequency offsets. Additional co-existence requirements, such as Wi-Fi and GPS receivers in the same handset, place yet more constraints on the amplifier performance.

Managing PA distortion, without unduly sacrificing power consumption, is therefore a major consideration for designers of chipsets, PAs, and end-products alike. DPD works by inverting the measured gain and/or phase distortion of an amplifier, and "pre-distorting" the input signal to compensate for the PA distortion, with the goal of achieving a combined response which is linear, as shown in FIG. 1, for example.

FIG. 1 is a diagram illustrating an exemplary predistorter 110 that is pre-distorting an input signal Vin for a PA 120, such that the linearity of the PA 120 may be achieved. As shown in FIG. 1, three response curves are shown below the schematic diagram of the predistorter 110 and the PA 120, and they comprise a predistorter response on the left, an amplifier response in the middle, and an overall response on the right. With the predistorter 110, the final signal that is output by the PA 120 has a greater linearity than that shown in the amplifier response.

However, the conventional DPD technology is not able to handle impacts introduced by the trapping effect of GaN transistors as described in the Background section, especially when signals of EUTRA Test Model 2a (E-TM2a) are involved for example.

Therefore, a novel signal compensation method, named "Digital Trapping Correction (DTC)", is introduced in some embodiments of the present disclosure. In some embodiments of the present disclosure, power of TX data to be transmitted may go through a low pass filter (e.g., an infinite impulse response (IIR) filter) and then the output of the low pass filter may function as an address index to select which value of a DTC lookup table (LUT) will be used to correct the current distortion caused by the trapping effect of a GaN transistor. Further, in some embodiments, the LUT may be updated adaptively. The adaptive update of LUT may be achieved by an adaptor. The adaptor may collect the TX data and corresponding TOR data, and then calculate a power level of the data to decide which level of current capture data is belonged to. Further, the adaptor may calculate correction values for a period of time to accumulate the correction values, and then the accumulated correction values may be used for updating the DTC LUT. Please note that although LUT is used for mapping a power level to a compensation signal in some embodiments of the present disclosure, the present disclosure is not limited thereto. In some other embodiments, other methods for mapping may be used. For example, one or more thresholds, a mathematical function, or the like may be used for mapping the power level to its corresponding compensation signal.

With this DTC technology, several advantages may be achieved:

- no conventional GaN booster needed;
- no power efficiency loss;
- no need to make a GaN TCT;
- no additional hardware is required to implement this solution; and
- much better PA performance.

Figure 2:
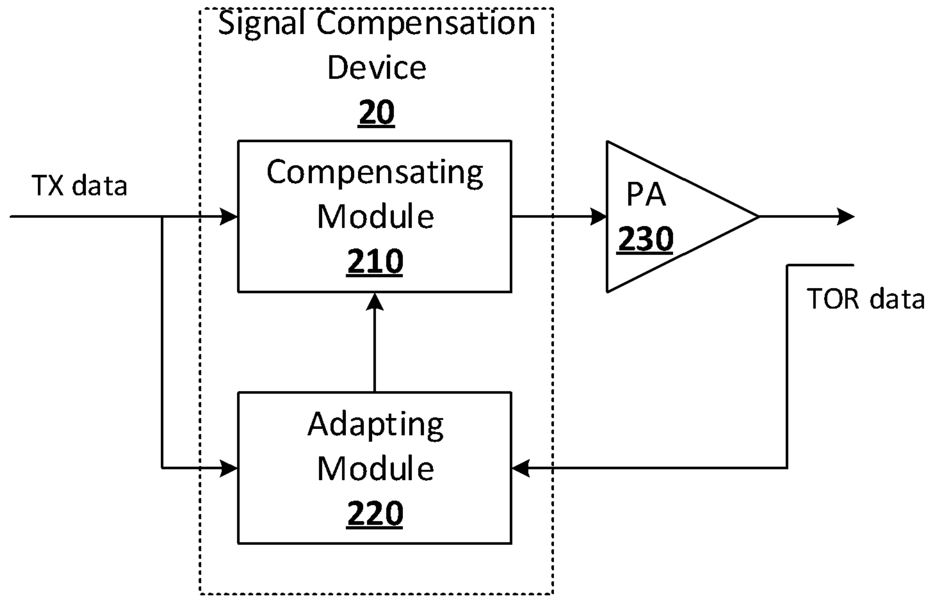
FIG. 2 is a schematic diagram illustrating an exemplary device for digital signal compensation according to an embodiment of the present disclosure.

FIG. 2 is a schematic diagram illustrating an exemplary device 20 for digital signal compensation according to an embodiment of the present disclosure. As shown in FIG. 2, the device 20 may comprise a compensating module 210 and an adapting module 220. Further, the signal compensation device 20 may be electrically coupled between an input signal (i.e., TX data) and a PA (e.g., a GaN-based PA) 230 to compensate the input signal to be amplified by the PA 230 in a different manner than the predistorter 110 shown in FIG. 1, which will be described in detail below.

In some embodiments, the compensating module 220 may compensate the TX data to cancel any impacts introduced by the trapping effect of the GaN PA 230 or any other effect that may cause distortion. In some embodiments, the adapting module 220 may adaptively update the compensating module 210 such that the impacts can be cancelled in a more adaptive and precise manner and the performance of the PA 230 can be further improved.

In some embodiments, each of the compensating module 210 and the adapting module 220 may be a piece of physical hardware. For example, the compensating module 210 may be an ASIC or FPGA that is dedicated for digital signal compensation, and the adapting module 220 may be a DSP that is programed to adaptively update the compensating module 210, such that the trapping effect of the PA 230 may be corrected or cancelled in an adaptive manner. However, the present disclosure is not limited thereto. In some other embodiments, the modules of the device 20 may be implemented by pure software that is executed by a general purpose processor, such as a CPU or DSP, or a combination of hardware, firmware, and/or software. In other words, as long as the same functions are implemented, any of hardware, firmware, and software or any combination thereof are applicable.

Figure 3:
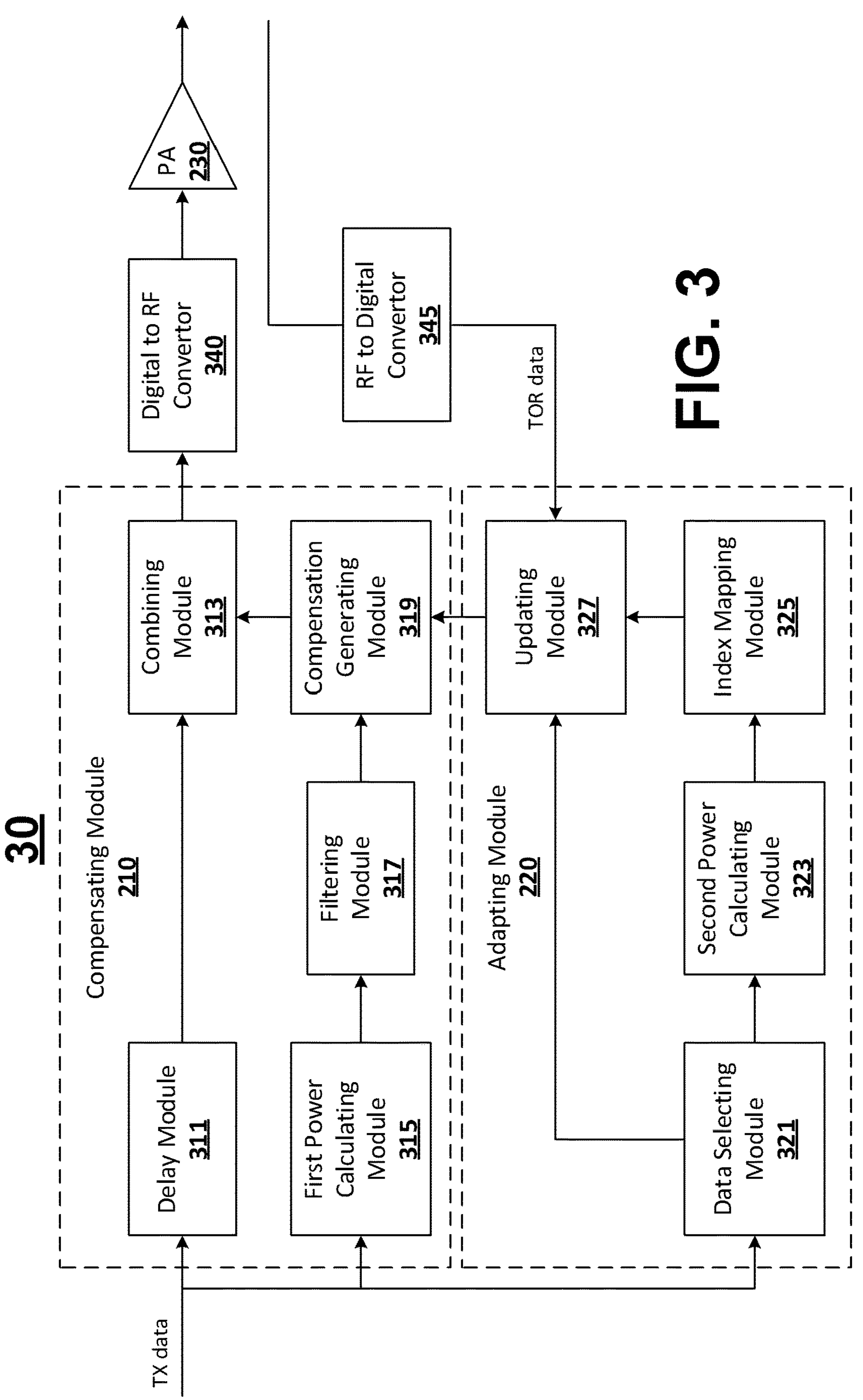
FIG. 3 is a schematic diagram illustrating an exemplary implementation of the device shown in FIG. 2.

FIG. 3 is a schematic diagram illustrating an exemplary implementation 30 of the device 20 shown in FIG. 2. As shown in FIG. 3, the compensating module 210 may comprise one or more modules for generating compensated TX data based on the original TX data to be amplified. The one or more modules may comprise but not limited to a delay module 311, a combining module 313, a first power calculating module 315, a filtering module 317, and a compensation generating module 319. However, the present disclosure is not limited thereto. In other embodiments, more modules, less modules, and/or different modules may be comprised in the compensating module 210.

Referring to FIG. 3, the power of every sample of the TX data signal may be calculated at the first power calculating module 315, and then the calculated power may go through the filtering module 317 (e.g., a low pass filter). In some embodiments, a low pass filter may serve as the filtering module 317, such that the power of the samples of the TX data signal may be smoothed, for example, as shown in FIG. 9.

Figure 9:
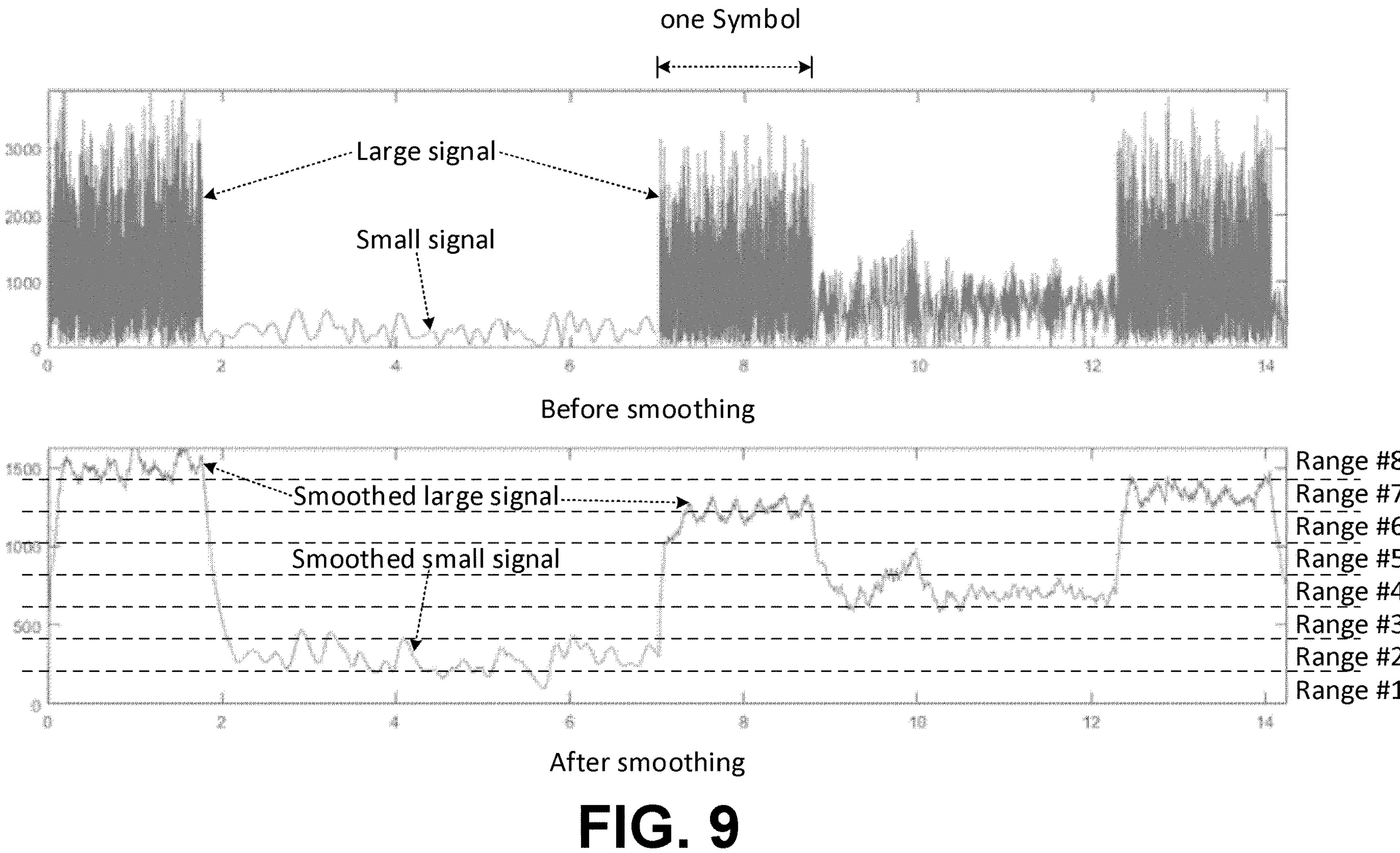
FIG. 9 shows a comparison between RF signals before and after smoothing according to an embodiment of the present disclosure.

FIG. 9 shows a comparison between RF signals before and after smoothing according to an embodiment of the present disclosure. In FIG. 9, the horizontal axis represents time, while the vertical axis represents power amplitude. Further, the time unit is about 36 microseconds long. For example, a symbol may span approximately two time units or less depending on its formats as shown in FIG. 9.

As shown in FIG. 9, RF signals for E-TM2a mode may comprise large signals and small signals, for example, those indicated by the arrows in the top portion in FIG. 9. Please note that the terms "large signal" and "small signal" used herein may refer to signals having a larger power amplitude and a smaller power amplitude, respectively. In some embodiments, a power threshold for distinguishing a large signal from a small signal may be determined empirically and/or based on the RF signals. That is, any signal that has a larger power amplitude than the power threshold may be referred to as a large signal, while any signal that has a smaller power amplitude than the power threshold may be referred to as a small signal. Further, when a signal has a power amplitude equal to the power threshold, it may be referred to as either a large signal or a small signal, depending on which one is more appropriate or needed.

As mentioned above, the trapping effect of the GaN-based PA will degrade its performance, especially when both of large signals and small signals are present, for example, the RF signals for E-TM2a mode shown in FIG. 9. With the filtering module 317 or the low pass filter, the large signals and small signals may be smoothed as shown in the bottom portion of FIG. 9. As can be observed from FIG. 9, high frequency components of the RF signals are filtered out, and only low frequency components are reserved for subsequent operations. In some embodiments, the low pass filter may have a very low cut-off frequency to an extent that the smoothed signal may have no or less details of the original RF signals and are suitable for an index signal for subsequent operations while the smoothed large signal can still be distinguished from the smoothed small signal. In some embodiments, the cut-off frequency of the low pass filter may be configured or set empirically, and/or based on the RF signals, the specific requirements of the PA 230, and/or other factors.

After that, the output of the filtering module 317 may be mapped to one of multiple levels at the compensation generating module 319, and the determined level may be used as an LUT index for the compensation generating module 319 to retrieve a value from the LUT and generate a compensation signal based thereon. As mentioned above, the present disclosure is not limited thereto. In some other embodiments, the compensation generating module 319 may generate the compensation signal by using other methods than the LUT, for example, by using a mathematical function, by comparing the filtered signal with one or more thresholds and then determining and generating the compensation signal based on the comparisons, for example, as shown by multiple ranges, Range #1 to Range #8, in FIG. 9.

Meanwhile, the original TX data may be delayed by the delay module 311 such that the delayed TX data may be temporally aligned with or synchronized with the compensation signal. Finally, the compensation signal may be combined at the combining module 313 with the delayed TX data to generate a compensated TX signal.

In some embodiments, the first power calculating module 315, the filtering module 317, and the compensation generating module 319 together may be configured to generate a digital compensation signal (e.g., the compensation signal mentioned above) at least partially based on smoothing, in real time, a digital input signal (e.g., the TX data shown in FIG. 3) or a signal that is derived from the digital input signal (e.g., the calculated power signal or the filtered power signal as will be described below). Further, the delay module 311 may be configured to delay the digital input signal such that the delayed digital input signal may be aligned with the digital compensation signal in the time domain. Furthermore, the combining module 313 may be configured to generate a digital compensated signal by combining the delayed digital input signal with the digital compensation signal.

Figure 4:
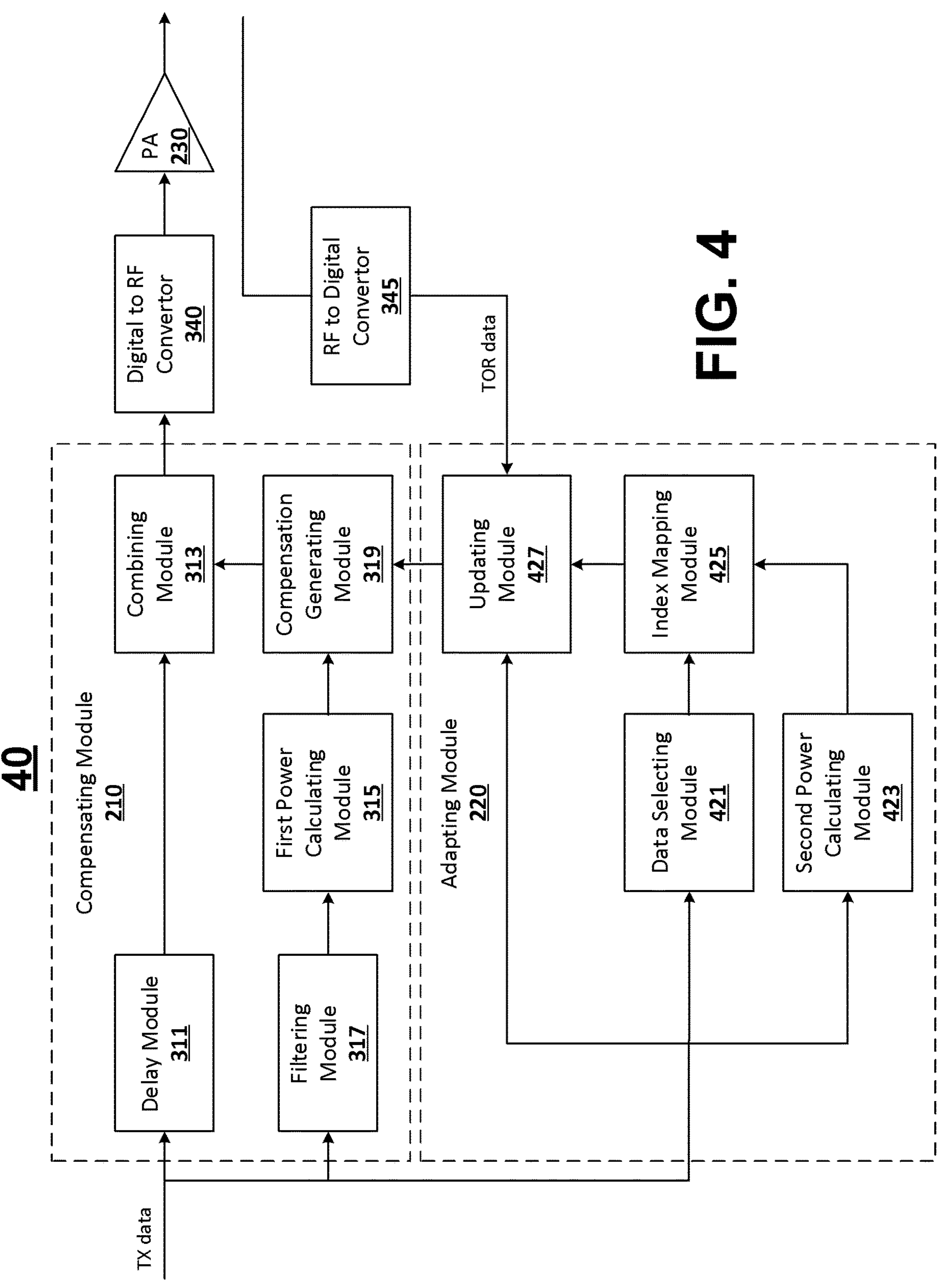
FIG. 4 is a schematic diagram illustrating another exemplary implementation of the device shown in FIG. 2.

In some embodiments, the first power calculating module 315 may be configured to generate a first power signal from the digital input signal. In some embodiments, the filtering module 317 may be configured to generate a first processed signal by smoothing the first power signal in real time. In some embodiments, the compensation generating module 319 may be configured to generate the digital compensation signal at least partially based on the first processed signal. However, the present disclosure is not limited thereto. For example, as will be described with reference to FIG. 4, a different processing sequence may be used. For example, as shown in FIG. 4, a smoothed signal may be generated by the filtering module 317 based on the TX data first, and then the first processed signal may be generated by the first power calculating module 315 from the smoothed signal. In other words, the order of the filtering module 317 and first power calculating module 315 in term of processing sequence may be reversed with respect to FIG. 3.

In some embodiments, the first power signal may be generated as follows:

$$\text{power}(k) = I^2(k) + Q^2(k)$$

where I(k) and Q(k) are in-phase and quadrature components of the $k^{th}$ sample of the digital input signal (e.g., as shown in FIG. 3) or the smoothed signal (e.g., as shown in FIG. 4) in an updating period, respectively. In some embodiments, the smoothing may be performed by a low pass filter that has a cut-off frequency such that a smoothed large signal can be distinguished from a smoothed small signal. In other words, the filtering module 317 may be a low pass filter. In some embodiments, the filtering module 317 may be a cascaded integrator—comb (CIC) filter or IIR filter, or even a long taps low pass filter that can work as a low pass filter to smooth the power. Then the output of filter may be mapped to an address index, to select a value from the LUT to correct the trapping effect.

In some embodiments, the compensation generating module 319 may be configured to determine one of multiple power ranges corresponding to the first processed signal, and generate a digital compensation signal corresponding to the determined power range. In some embodiments, the compensation generating module 319 may be configured to compare the first processed signal with one or more thresholds by which the multiple power ranges are defined, and determine the power range corresponding to the first processed signal based on a result of the comparison. In other words, the first processed signal may be used as an indicator or index associated with a corresponding power range for retrieving a corresponding value from an LUT, which may be used for generating the compensation signal.

In some embodiments, the compensation generating module 319 may be configured to use the determined power range as an index into the LUT to retrieve a corresponding entry from the LUT, and generate the digital compensation signal based on the retrieved entry. In some embodiments, the initial values of the entries of the LUT may be 1, and the LUT may be adaptively updated as will be described in details below. In some embodiments, the combining module 313 may be configured to generate the digital compensated signal by multiplying the delayed digital input signal with the digital compensation signal.

In some embodiments, the delay introduced by the compensating module 210 can almost be neglected when compared with the duration of each of the RF signals, and therefore the digital signal compensation may be referred to as real-time digital signal compensation. For example, in some experiments, the delay is about 5 microseconds, while the duration of a symbol is about 72 microseconds, as can be seen from FIG. 9. In such a case, no buffer is needed for the real time operations of the digital signal compensation.

Further, as shown in FIG. 3, the adapting module 220 may comprise but not limited to a data selecting module 321, a second power calculating module 323, an index mapping module 325, and an updating module 327. However, the present disclosure is not limited thereto. In other embodiments, more modules, less modules, and/or different modules may be comprised in the compensating module 210.

Referring to FIG. 3, TOR data may be feedback to the adapting module 220, and then the adapting module 220 may capture the TX and TOR data simultaneously. After that, trapping offsets may be calculated based thereon, and the offsets may be accumulated in every period. In some embodiments, a period may be on the order of milliseconds or more. After every period, the LUT may be updated based on the accumulated offset value. For example, the LUT may be updated by multiplying the accumulated offset value with corresponding entries from the previous LUT. Further, in some other embodiments where the LUT is not used, the mapping between power levels and the corresponding compensation signals may be updated based on the TX data and the TOR data in a similar manner.

In some embodiments, for every time after capturing the TOR and TX data, the adapting module 220 may detect the total power of current captured data to decide which level of current TX data belonged to (for example, in a similar manner to the first power calculating module 315), and also the adapting module 220 may detect the flatness of the current data. If the captured stimulation signal to the PA 230 is at an edge when there is a big scale of power changing, then the trapping offset may be polluted, which means the corresponding TX data might not be selected for updating the LUT. Therefore, the flatness of data captured every time may be detected by the data selecting module 321 as shown in FIG. 3. In some embodiments, the flatness may be PAR of power, or standard deviation, or other methods to judge whether the current data is at smooth status or not. If the current data is smooth enough, then the corresponding offset value is valid and may be accumulated and finally updated into the LUT by the updating module 327.

In some embodiments, the adapting module 220 may be configured to adaptively update at least one value, from which at least one corresponding compensation signal is generated, based on one or more digital input signals and one or more corresponding digital compensated signals that are amplified (e.g., the TOR data). In some embodiments, the one or more corresponding digital compensated signals that are amplified may be one or more digital TOR signals, as shown in FIG. 3.

In some embodiments, the data selecting module 321 may be configured to select a set of digital input signals from the one or more digital input signals based on a flatness of each of the one or more digital input signals. In some embodiments, a flatness of a signal may indicate whether the signal has a change in power greater than or equal to a threshold or not. In some embodiments, the updating module 327 may be configured to adaptively update at least one value at least partially based on the set of the digital input signals. In some embodiments, the data selecting module 321 may be configured to select the set of the digital input signals by filtering out any digital input signal having a flatness greater than or equal to the threshold from the one or more digital input signals. In some embodiments, the flatness may be a peak-to-average-ratio (PAR) or a standard deviation of power of multiple samples of the digital input signal. In other words, with the data selecting module 321, any TX data that may pollute the offsets calculated for compensating the trapping effect may be dropped, such that the updating of the LUT may further improve the performance of the signal compensation.

In fact, to monitor the flatness of current captured data, there are a lot of methods to do so. One of the method is that make all the power of every samples of the captured data go through a low pass filter, and calculate the PAR of output of filter and set a threshold. If the calculated PAR is higher than the threshold then it may mean that the current captured data is at the edge of big scale of power changing, and then the current offset value may not be used to update the LUT. In other words, the current data may be dropped or not selected for subsequent operations. On the other hand, if the calculated PAR is not higher than the threshold, then its corresponding offset value may be used for updating the LUT, and therefore accumulated for subsequent operations.

In some embodiments, the updating module 327 may be configured to align one or more digital input signals that are input during an updating period and their corresponding digital TOR signals in the time domain, respectively. Further, in some embodiments, the updating module 327 may be configured to normalize the one or more digital input signals and their corresponding digital TOR signals. In some embodiments, the normalization of the TOR data may be done at any power level, and it will not impact the final performance.

In some embodiments, the second power calculating module 323 may perform similar operations as those by the first power calculating module 315, and therefore a detailed description thereof is omitted for simplicity. In some embodiments, the index mapping module 325 may be configured to map the calculated power of the selected TX data to a power range or an index for the LUT. In other words, a power range or an index may be determined to be associated with the selected TX data by the index mapping module 325 for subsequent updating operations at the updating module 327.

Further, in some embodiments, the updating module 327 may be configured to, for each set of digital input signals that are input during the updating period and that are associated with a same power range, calculate an offset based on the corresponding set of digital input signals and the corresponding digital TOR signals that are aligned in the time domain and normalized. Further, in some embodiments, the updating module 327 may be configured to, for the each set of digital input signals that are input during the updating period and that are associated with the same power range, calculating a corresponding weight based on a corresponding offset. Further, in some embodiments, the updating module 327 may be configured to update the at least one value based on the calculated weights.

In some embodiments, an offset may be calculated as follows:

$$OST_{current}(\text{index}) = \frac{\sum_{k=0}^{L-1} |Tx(k)|^2}{\sum_{k=0}^{L-1} Tor(k).*conj(Tx(k))}$$

where index is the index of a corresponding entry of the LUT, $OST_{current}$(index) is the offset for the corresponding entry in the current updating period, Tor(k) is the $k^{th}$ sample data of the digital TOR signal in the current updating period, Tx(k) is the $K^{th}$ sample data of the digital input signal in the current updating period, L is the number of sample data sampled in an updating period, ".*" is an operator for calculating a dot product of its operands, and conj(·) is an operator for calculating a conjugate of its operand.

In some embodiments, a weight may be calculated as follows:

$$W_{new}(\text{index}) = W_{current}(\text{index}) * (1-\alpha) + OST_{current}(\text{index}) * \alpha$$

where $W_{current}$(index) is the weight for the corresponding entry in the current updating period, $W_{new}$(index) is the weight calculated for updating the corresponding entry, and $\alpha$ is a constant.

In some embodiments, the LUT may be updated as follows:

$$LUT_{new}(\text{index}) = LUT_{current}(\text{index}) * W_{current}(\text{index}),$$
$$\text{index} = 0, 1, 2 \ldots Dep - 1$$

where $LUT_{current}$(index) is the corresponding entry of the LUT in the current updating period, $LUT_{new}$(index) is the calculated entry that will replace $LUT_{current}$(index) for updating, and Dep is the number of entries of the LUT.

In some embodiments, the updating period may be on the order of milliseconds. In some embodiments, the initial values of the weights may be 1.

Although a certain configuration of modules of the compensating module 210 and/or the adapting module 220 are shown and described with reference to FIG. 3, the present disclosure is not limited thereto. In fact, one or more different configurations of these modules may be used, for example, as shown in FIG. 4.

FIG. 4 is a schematic diagram illustrating another exemplary implementation of the device shown in FIG. 2. Please note that some of the modules shown in FIG. 4 are same as or similar to those shown in FIG. 3, and therefore a detailed description thereof is omitted for simplicity.

As shown in FIG. 4 and also described above, the compensating module 210 shown in FIG. 4 may have same or similar modules as those shown in FIG. 3, but with a different configuration. In the embodiment shown in FIG. 4, the processing sequence of the filtering module 317 and the first power calculating module 315 is reversed with respect to that shown in FIG. 3. In other words, a power of the TX data is calculated first and then the calculated power is smoothed as shown in FIG. 3, while the TX data is smoothed first and then the power of the smoothed signal is calculated as shown in FIG. 4.

As also shown in FIG. 4, the adapting module 220 shown in FIG. 4 may have same or similar modules as those shown in FIG. 4, but with a different configuration as well. In the embodiment shown in FIG. 3, the TX data is first processed by the data selecting module 321 to filter out any TX data that may pollute the offsets, and data processed by all other modules are related to the data used for updating the LUT. By contrast, in the embodiment shown in FIG. 4, all the TX data will be processed by the second power calculating module 423 and the updating module 427 irrespective of whether the TX data can be used for updating the LUT or not, and the operation of filtering out those data that may pollute the offsets is performed simultaneously or later at the data selecting module 421 and then the index mapping module 425. In some embodiments, the index mapping module 425 may be configured to generate an index or an indicator indicating a power range associated with the TX data when the data selecting module 421 indicates that the TX data is qualified for subsequent operation, and to inhibit or prevent from generating the index or the indicator when the data selecting module 421 indicates that the TX data is not qualified for the subsequent operations as described above. In this way, when the TX data is not qualified, no index or indicator will be generated by the index mapping module 425, and the updating module 427 will not perform any operations in such a situation, thereby achieving a similar effect to that shown in FIG. 3.

Nevertheless, the present disclosure is not limited to the embodiments shown by and described with reference to FIG. 3 and FIG. 4. In other embodiments, any other configurations of the device for digital signal compensation may be possible.

With the embodiments described above, the trapping effect of the GaN PA may be suppressed or cancelled, and a better performance of the PA may be achieved.

Figure 5A:
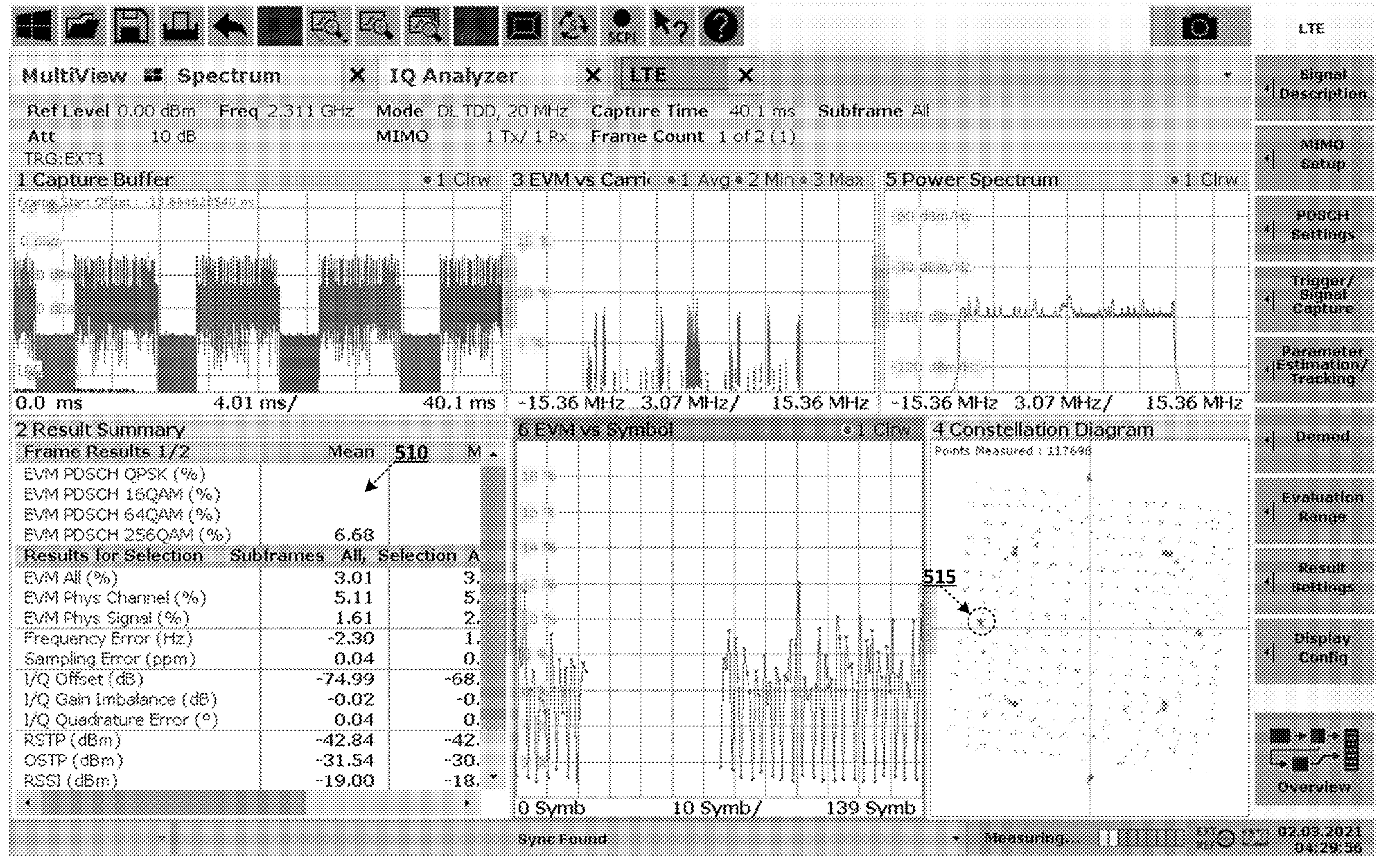
FIG. 5A shows a comparison between field tests for RF signals that are amplified by a power amplifier with and without the digital signal compensation according to an embodiment of the present disclosure.
Figure 5A:
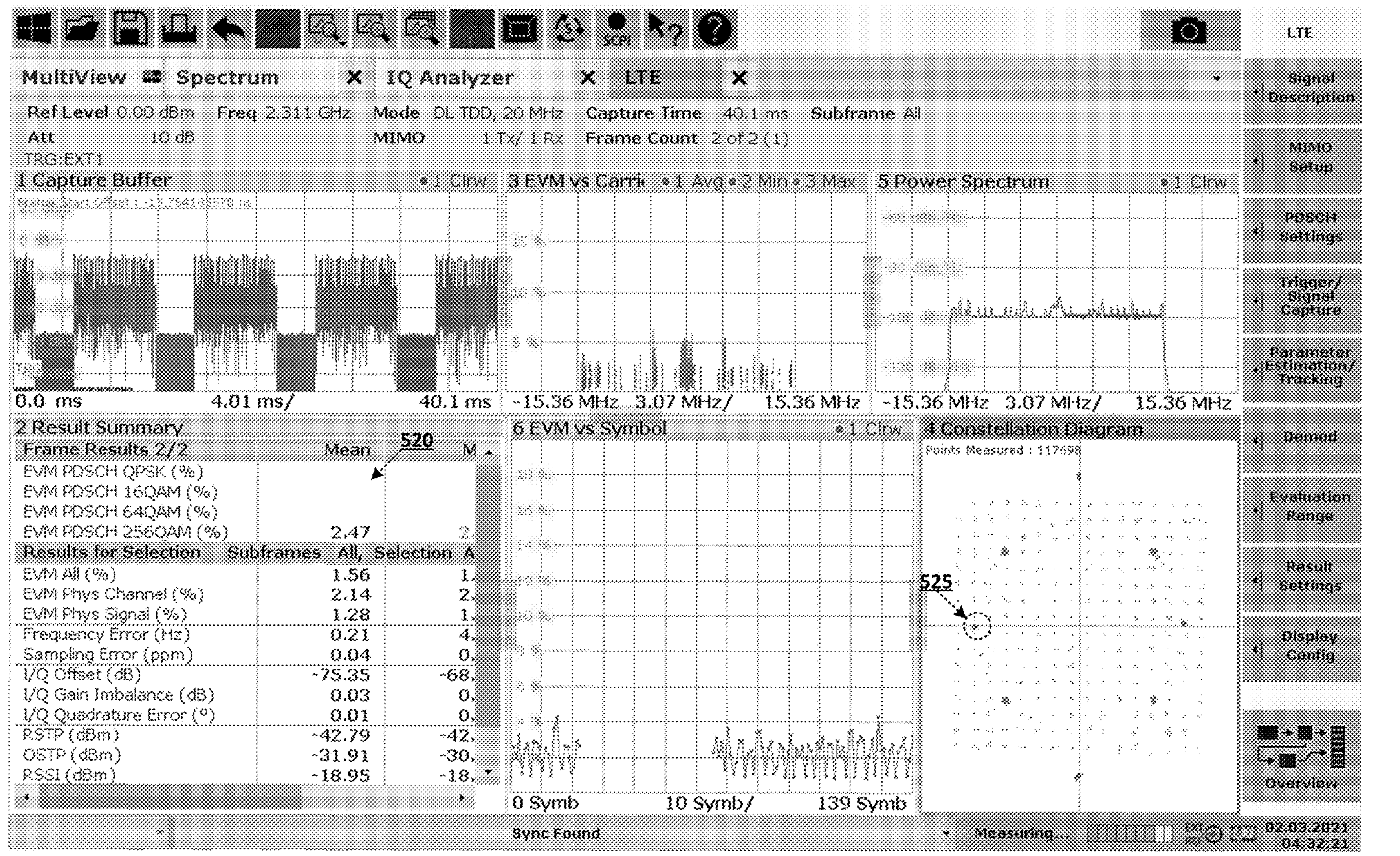
Figure 5B:
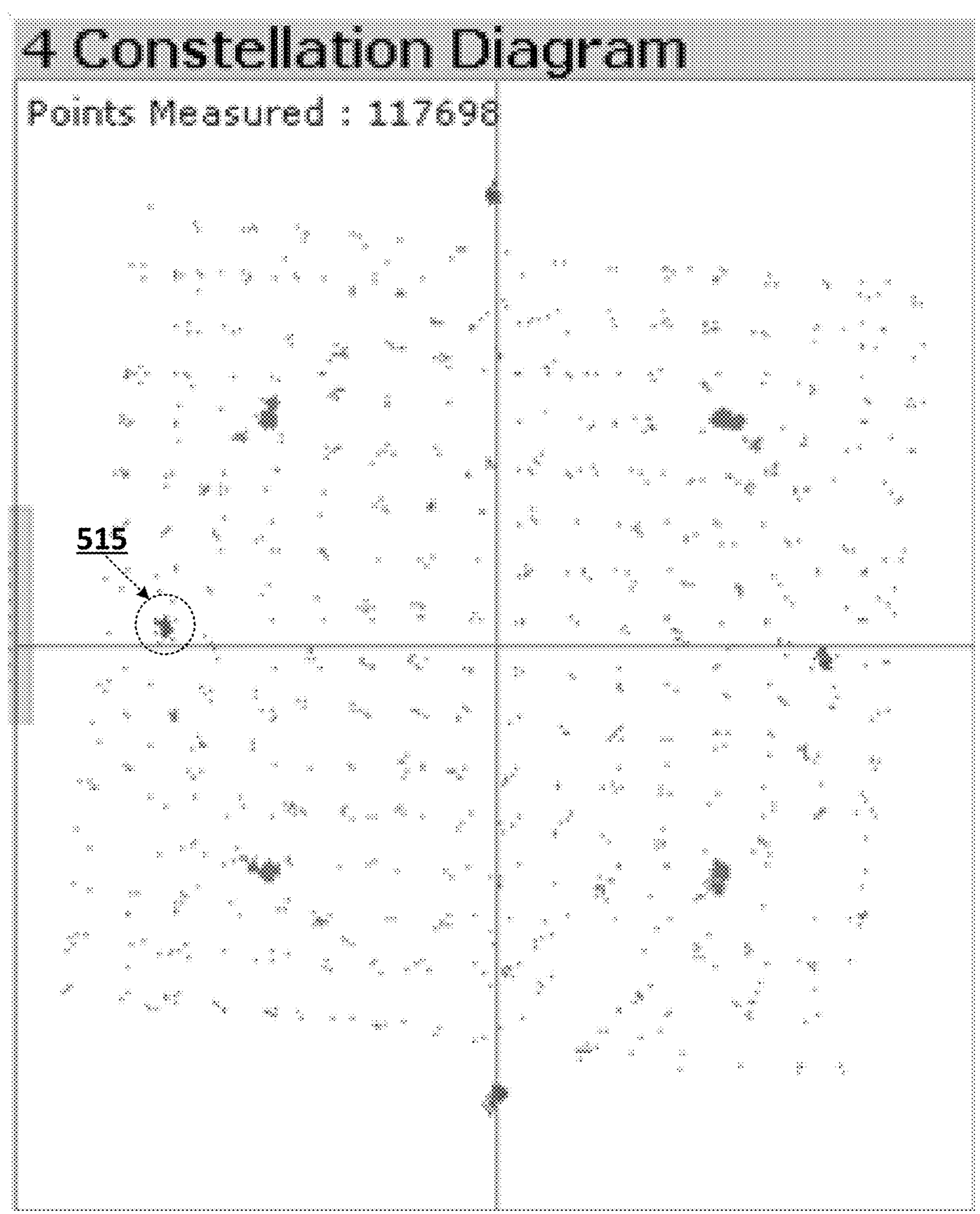
FIG. 5B shows enlarged views of the constellation diagrams shown in FIG. 5A.
Figure 5B:
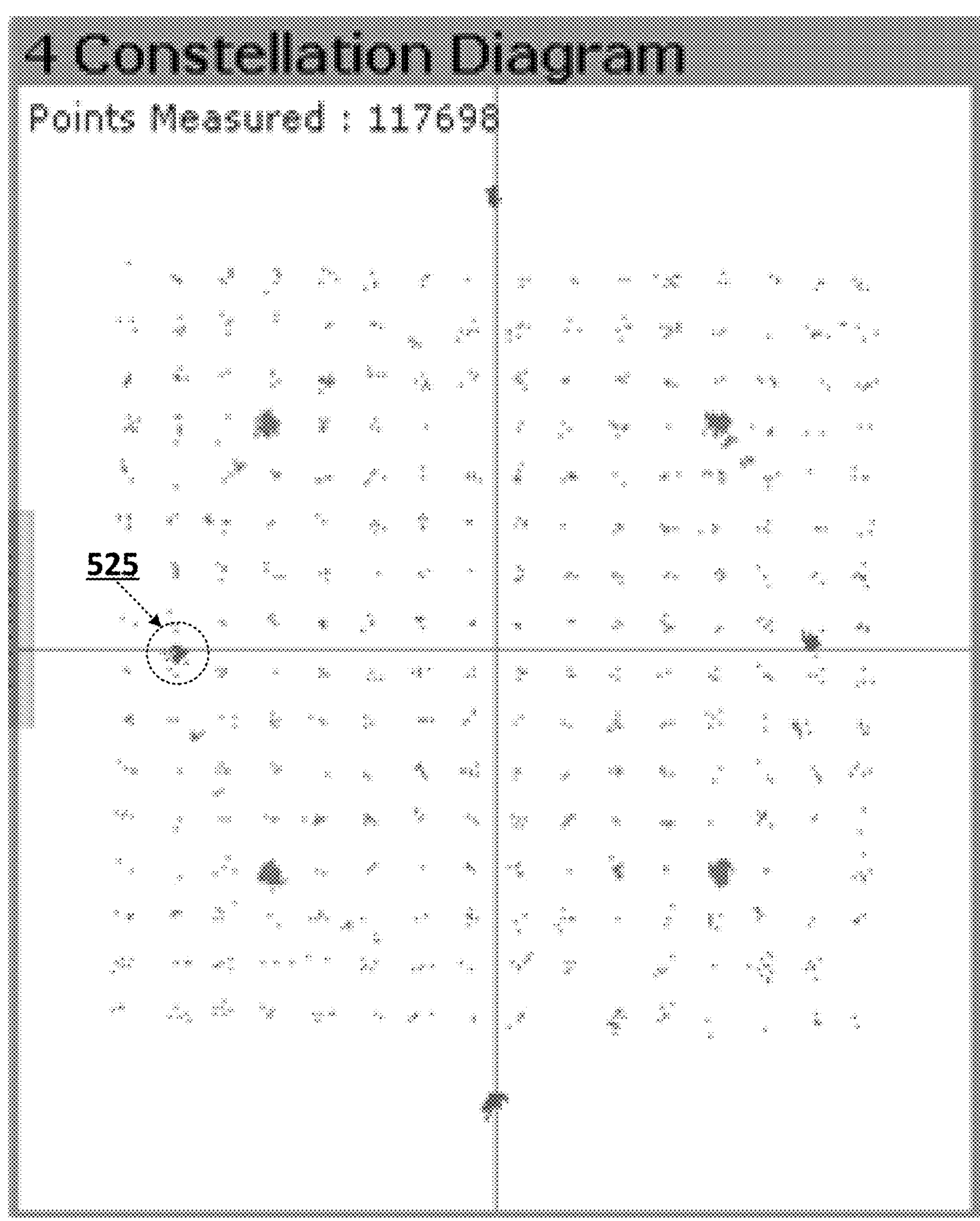

FIG. 5A shows a comparison between field tests for RF signals that are amplified by a power amplifier with and without the digital signal compensation according to an embodiment of the present disclosure, and FIG. 5B shows enlarged views of the constellation diagrams shown in FIG. 5A. The measurements are based on a classic macro radio product. When an LUT of 8 entries is used, the EVM for E-TM2A is 6.68% before the DTC is enabled, while the EVM for E-TM2A is 2.47% after the DTC is enabled, as indicated by arrows 510 and 520, respectively. More intuitively, it can be observed from FIG. 5B that there is an observable distance between a measured signal and its ideal signal on the horizontal axis when the DTC is not enabled as indicated by the arrow 515, while the measured signal and its ideal signal are almost overlapped with each other when the DTC is enabled as indicated by the arrow 525.

Figure 6A:
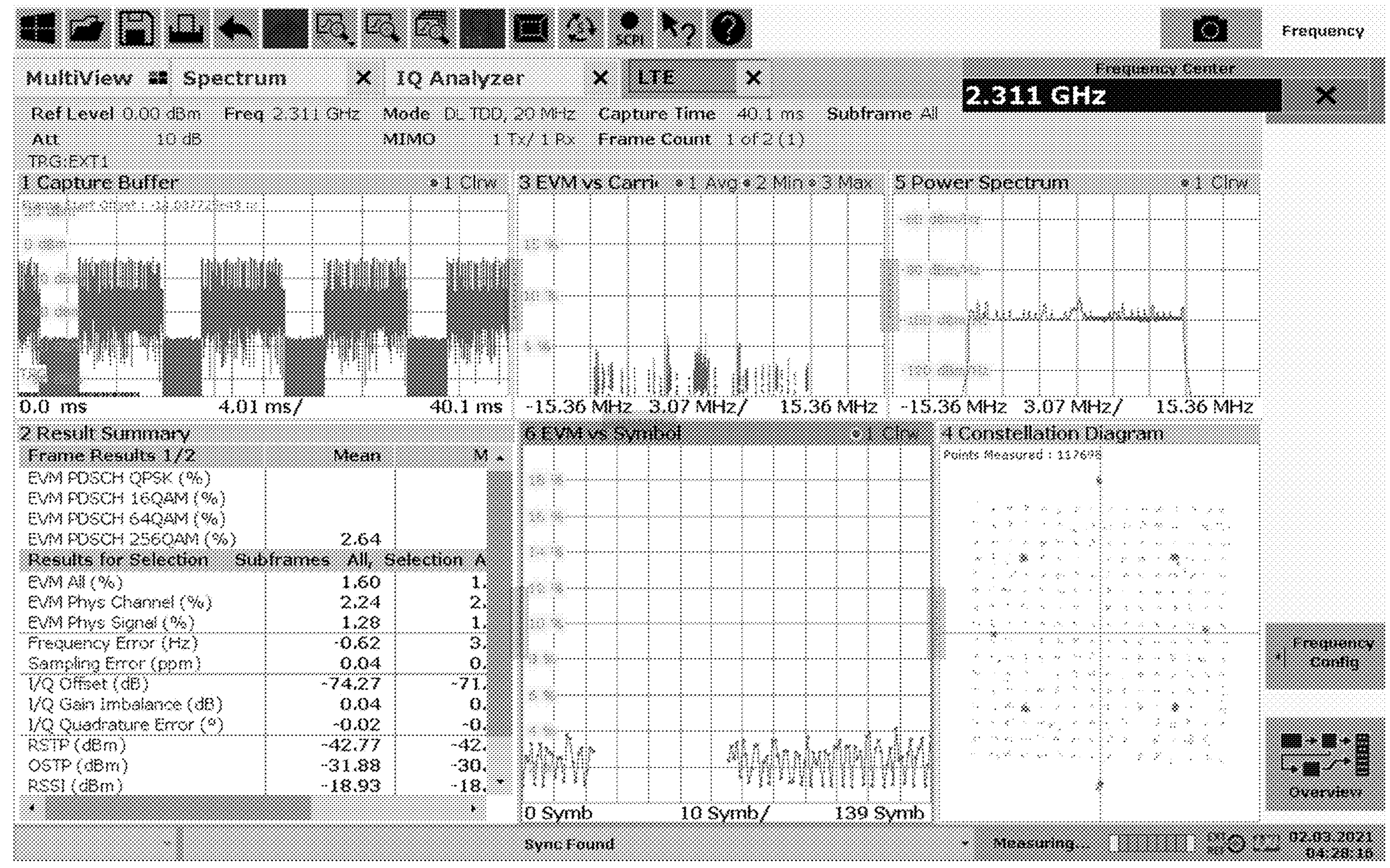
FIGS. 6A and 6B show a comparison between field tests for RF signals at different frequencies that are amplified by a power amplifier with the digital signal compensation according to an embodiment of the present disclosure.
Figure 6A:
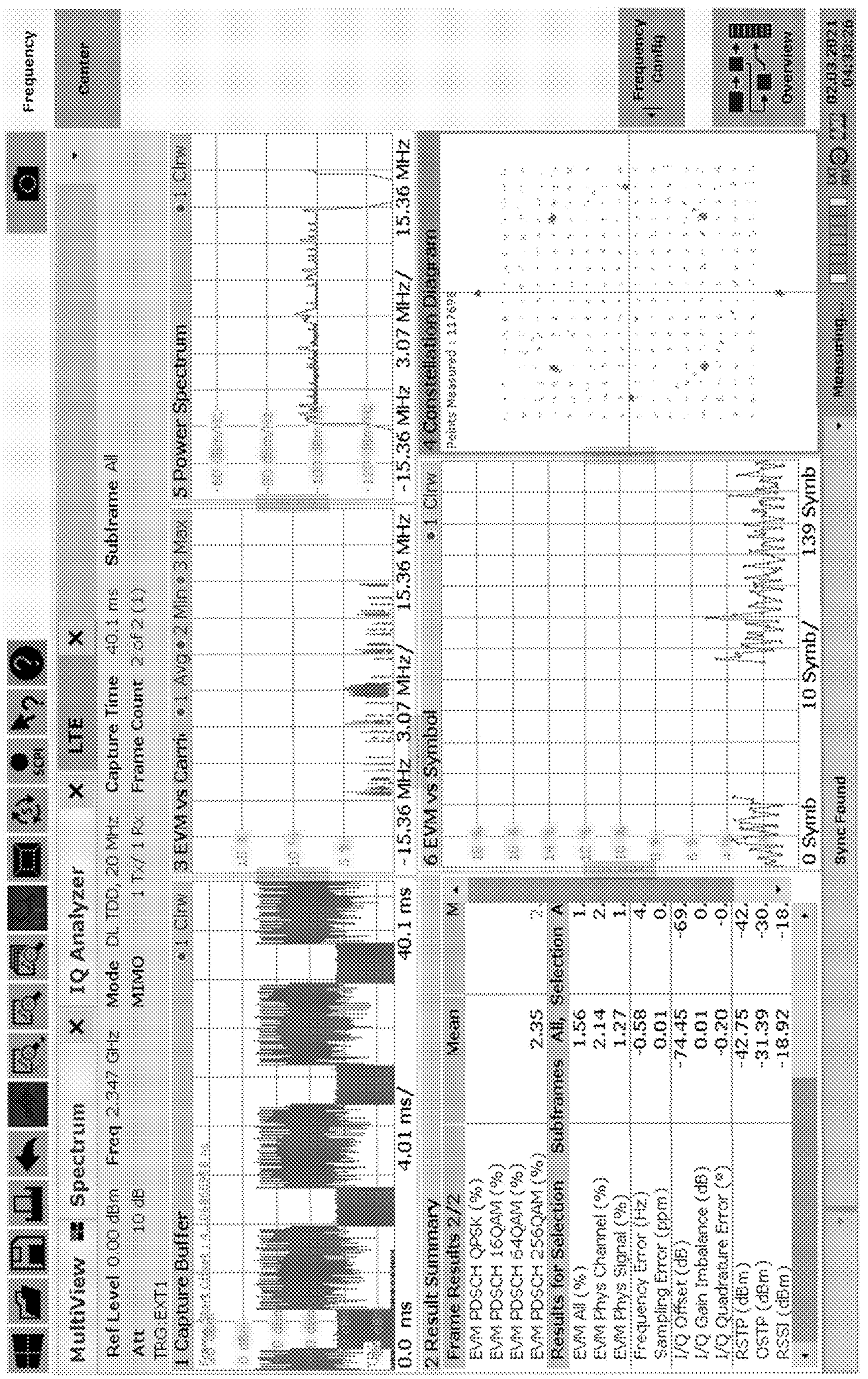
Figure 6B:
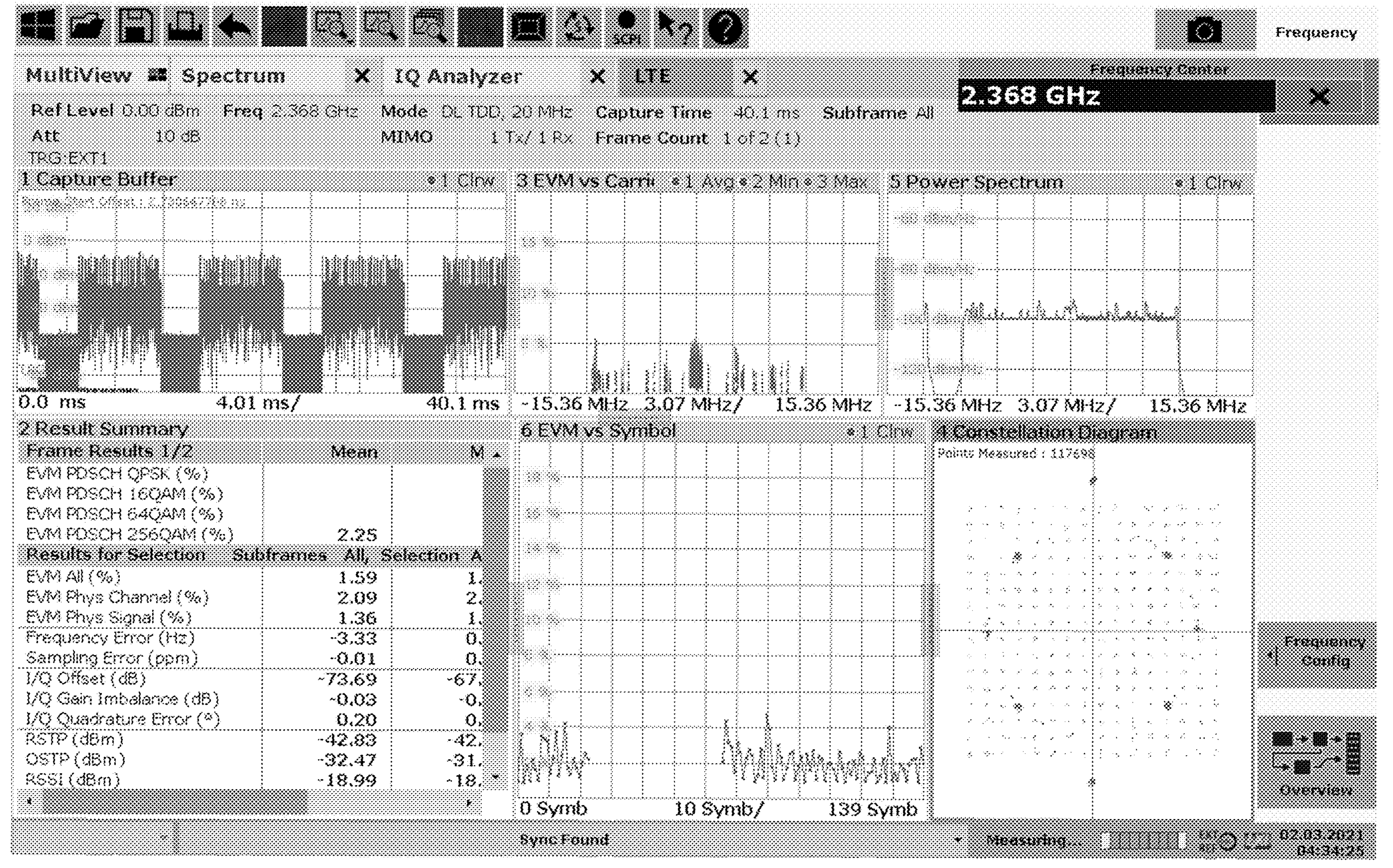

FIGS. 6A and 6B show a comparison between field tests for RF signals at different frequencies that are amplified by a power amplifier with the digital signal compensation according to an embodiment of the present disclosure. As shown in FIG. 6A and FIG. 6B, three carriers of 20M in TDD mode are measured for LTE E-TM2A. The center frequencies of the three carriers are 2.311 GHZ, 2.347 GHZ, and 2.368 GHZ, respectively. The EVMs for these three carriers are 6.71%, 6.45%, and 6.43%, respectively, before the DTC is enabled, while the EVMs are 2.64%, %2.35, and 2.25% after the DTC is enabled, respectively, as shown in FIG. 6A and FIG. 6B.

Therefore, with the embodiments of the present disclosure, several advantages may be achieved:

no conventional GaN booster needed;

no power efficiency loss;

no need to make a GaN TCT;

no additional hardware is required to implement this solution; and much better PA performance.

Further, below please find a table for comparison for other test models.

| 2C 20 MHz | EVM (%) DTC OFF | EVM (%) DTC ON |
|---|---|---|
| TM2A + TM2A | 6.05/5.82 | 2.29/2.33 |
| TM3P1 + TM2A | 1.5/1.32 | No observable change |
| TM3P1 + TM3P1 | 4.01/3.92 | No observable change |

It can be observed that the DTC may reduce the EVM for TM2A test signals to a great extent, and may not work well with the TM3P1 test signals since the TM3P1 signals have no significant changes in their power levels with respect to the TM2A test signals. On the other hand, the DTC does provide a similar performance to that of the conventional signal compensation technology for TM3P1 test signals, while a much better performance may be achieved by the DTC for TM2A test signals.

Figure 7:
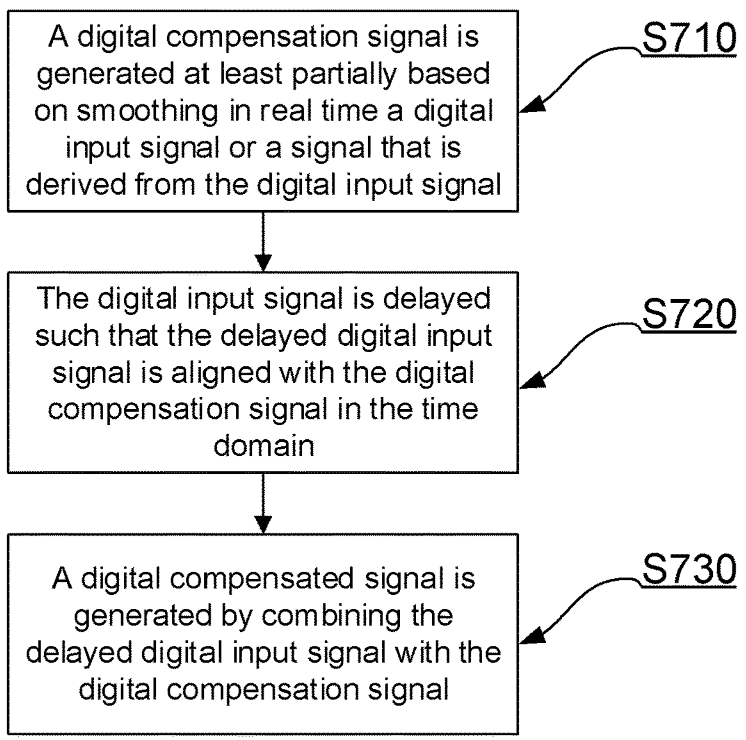
FIG. 7 is a flow chart illustrating an exemplary method for digital signal compensation according to an embodiment of the present disclosure.

FIG. 7 is a flow chart of an exemplary method 700 for signal compensation according to an embodiment of the present disclosure. The method 700 may be performed at a device for signal compensation (e.g., the device 20 shown in FIG. 2, the device 30 shown in FIG. 3, or the device 40 shown in FIG. 4). The method 700 may comprise step S710, S720, and Step S730. However, the present disclosure is not limited thereto. In some other embodiments, the method 700 may comprise more steps, less steps, different steps, or any combination thereof. Further the steps of the method 700 may be performed in a different order than that described herein. Further, in some embodiments, a step in the method 700 may be split into multiple sub-steps and performed by different entities, and/or multiple steps in the method 700 may be combined into a single step.

The method 700 may begin at step S710 where a digital compensation signal may be generated at least partially based on smoothing, in real time, a digital input signal or a signal that is derived from the digital input signal.

At step S720, the digital input signal may be delayed such that the delayed digital input signal may be aligned with the digital compensation signal in the time domain.

At step S730, a digital compensated signal may be generated by combining the delayed digital input signal with the digital compensation signal.

In some embodiments, the step S710 may comprise: generating a first processed signal at least partially based on smoothing, in real time, the digital input signal or the signal that is derived from the digital input signal; and generating the digital compensation signal at least partially based on the first processed signal. In some embodiments, the step of generating a first processed signal at least partially based on smoothing, in real time, the digital input signal or the signal that is derived from the digital input signal may comprise: generating a first power signal from the digital input signal; and generating the first processed signal by smoothing the first power signal in real time. In some embodiments, the step of generating a first processed signal at least partially based on smoothing, in real time, the digital input signal or the signal that is derived from the digital input signal may comprise: generating a smoothed signal by smoothing the digital input signal in real time; and generating, as the first processed signal, a first power signal from the smoothed signal.

In some embodiments, the first power signal may be generated as follows:

$$\text{power}(k) = I^2(k) + Q^2(k)$$

where I(k) and Q(k) are in-phase and quadrature components of the $k^{th}$ sample of the digital input signal or the smoothed signal in an updating period, respectively.

In some embodiments, the smoothing may be performed by a low pass filter that has a cut-off frequency such that a smoothed large signal can be distinguished from a smoothed small signal. In some embodiments, the step S710 may comprise: determining one of multiple power ranges corresponding to the first processed signal; and generating a digital compensation signal corresponding to the determined power range. In some embodiments, the step of determining one of multiple power ranges corresponding to the first processed signal may comprise: comparing the first processed signal with one or more thresholds by which the multiple power ranges are defined; and determining the power range corresponding to the first processed signal based on a result of the comparison. In some embodiments, the step of generating a digital compensation signal corresponding to the determined power range comprises: using the determined power range as an index into a lookup table (LUT) to retrieve a corresponding entry from the LUT; and generating the digital compensation signal based on the retrieved entry. In some embodiments, the initial values of the entries of the LUT are 1.

In some embodiments, the step S730 may comprise: generating the digital compensated signal by multiplying the delayed digital input signal with the digital compensation signal. In some embodiments, the method 700 may further comprise: adaptively updating at least one value, from which at least one corresponding compensation signal is generated, based on one or more digital input signals and one or more corresponding digital compensated signals that are amplified. In some embodiments, the one or more corresponding digital compensated signals that are amplified may be one or more digital transmitter observation receiver (TOR) signals.

In some embodiments, the step of adaptively updating at least one value comprises: selecting a set of digital input signals from the one or more digital input signals based on a flatness of each of the one or more digital input signals; and adaptively updating at least one value at least partially based on the set of the digital input signals, wherein a flatness of a signal indicates whether the signal has a change in power greater than or equal to a threshold or not.

In some embodiments, the step of selecting a set of digital input signals from the one or more digital input signals based on a flatness of each of the one or more digital input signals may comprise: selecting the set of the digital input signals by filtering out any digital input signal having a flatness greater than or equal to the threshold from the one or more digital input signals. In some embodiments, the flatness may be a peak-to-average-ratio (PAR) or a standard deviation of power of multiple samples of the digital input signal. In some embodiments, the step of adaptively updating at least one value may comprise: aligning one or more digital input signals that are input during an updating period and their corresponding digital TOR signals in the time domain, respectively; normalizing the one or more digital input signals and their corresponding digital TOR signals; for each set of digital input signals that are input during the updating period and that are associated with a same power range, calculating an offset based on the corresponding set of digital input signals and the corresponding digital TOR signals that are aligned in the time domain and normalized; for the each set of digital input signals that are input during the updating period and that are associated with the same power range, calculating a corresponding weight based on a corresponding offset; and updating the at least one value based on the calculated weights.

In some embodiments, an offset may be calculated as follows:

$$OST_{current}(\text{index}) = \frac{\sum_{k=0}^{L-1} |Tx(k)|^2}{\sum_{k=0}^{L-1} Tor(k).*conj(Tx(k))}$$

where index is the index of a corresponding entry of the LUT, $OST_{current}$(index) is the offset for the corresponding entry in the current updating period, Tor(k) is the $k^{th}$ sample data of the digital TOR signal in the current updating period, Tx(k) is the $k^{th}$ sample data of the digital input signal in the current updating period, L is the number of sample data sampled in an updating period, ".*" is an operator for calculating a dot product of its operands, and conj(·) is an operator for calculating a conjugate of its operand.

In some embodiments, a weight may be calculated as follows:

$$W_{new}(\text{index}) = W_{current}(\text{index}) * (1-\alpha) + OST_{current}(\text{index}) * \alpha$$

where $W_{current}$(index) is the weight for the corresponding entry in the current updating period, $W_{new}$(index) is the weight calculated for updating the corresponding entry, and $\alpha$ is a constant.

In some embodiments, the LUT may be updated as follows:

$$LUT_{new}(\text{index}) = LUT_{current}(\text{index}) * W_{current}(\text{index}),$$
$$\text{index} = 0, 1, 2 \ldots Dep-1$$

where $LUT_{current}$(index) is the corresponding entry of the LUT in the current updating period, $LUT_{new}$(index) is the calculated entry that will replace $LUT_{current}$(index) for updating, and Dep is the number of entries of the LUT.

In some embodiments, the updating period may be on the order of milliseconds. In some embodiments, the initial values of the weights may be 1.

Figure 8:
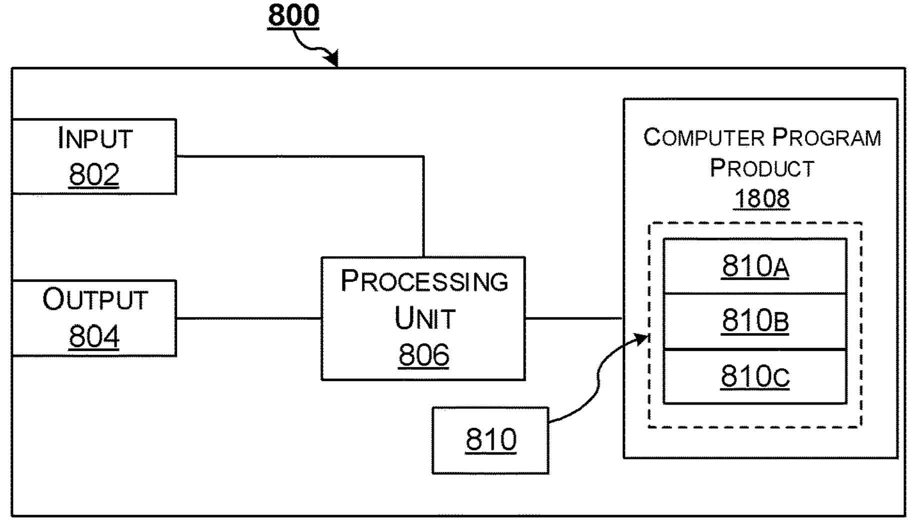
FIG. 8 schematically shows an embodiment of an arrangement which may be used in a device for digital signal compensation according to an embodiment of the present disclosure.

FIG. 8 schematically shows an embodiment of an arrangement which may be used in a device for digital signal compensation (e.g., the device 20 shown in FIG. 2, the device 30 shown in FIG. 3, or the device 40 shown in FIG. 4) according to an embodiment of the present disclosure. Comprised in the arrangement 800 are a processing unit 806, e.g., with a Digital Signal Processor (DSP) or a Central Processing Unit (CPU). The processing unit 806 may be a single unit or a plurality of units to perform different actions of procedures described herein. The arrangement 800 may also comprise an input unit 802 for receiving signals from other entities, and an output unit 804 for providing signal(s) to other entities. The input unit 802 and the output unit 804 may be arranged as an integrated entity or as separate entities.

Furthermore, the arrangement 800 may comprise at least one computer program product 808 in the form of a non-volatile or volatile memory, e.g., an Electrically Erasable Programmable Read-Only Memory (EEPROM), a flash memory and/or a hard drive. The computer program product 808 comprises a computer program 810, which comprises code/computer readable instructions, which when executed by the processing unit 806 in the arrangement 800 causes the arrangement 800 and/or the device for digital signal compensation in which it is comprised to perform the actions, e.g., of the procedure described earlier in conjunction with FIG. 2 to FIG. 4 and/or FIG. 7 or any other variant.

The computer program 810 may be configured as a computer program code structured in computer program modules 810A-810C. Hence, in an exemplifying embodiment when the arrangement 800 is used in a device for digital signal compensation, the code in the computer program of the arrangement 800 includes a module 810A for generating a digital compensation signal at least partially based on smoothing, in real time, a digital input signal or a signal that is derived from the digital input signal; a module 810B for delaying the digital input signal such that the delayed digital input signal is aligned with the digital compensation signal in the time domain; and a module 810C for generating a digital compensated signal by combining the delayed digital input signal with the digital compensation signal.

The computer program modules could essentially perform the actions of the flow illustrated in FIG. 2 to FIG. 4 and/or FIG. 7, to emulate the device for digital signal compensation. In other words, when the different computer program modules are executed in the processing unit 806, they may correspond to different modules in the device for digital signal compensation.

Although the code means in the embodiments disclosed above in conjunction with FIG. 8 are implemented as computer program modules which when executed in the processing unit causes the arrangement to perform the actions described above in conjunction with the figures mentioned above, at least one of the code means may in alternative embodiments be implemented at least partly as hardware circuits.

The processor may be a single CPU, but could also comprise two or more processing units. For example, the processor may include general purpose microprocessors, instruction set processors and/or related chips sets and/or special purpose microprocessors such as ASICs. The processor may also comprise board memory for caching purposes. The computer program may be carried by a computer program product connected to the processor. The computer program product may comprise a computer readable medium on which the computer program is stored. For example, the computer program product may be a flash memory, a Random-access memory (RAM), a Read-Only Memory (ROM), or an EEPROM, and the computer program modules described above could in alternative embodiments be distributed on different computer program products in the form of memories within the devices.

The disclosure has been described with reference to embodiments and drawings. It should be understood that various modifications, alternations and additions can be made by those skilled in the art without departing from the spirits and scope of the disclosure. Therefore, the scope of the disclosure is not limited to the above particular embodiments but only defined by the claims as attached and equivalents thereof.

| Abbreviation | Explanation |
|---|---|
| TX | Transmission link |
| TOR | Transmission Observation receiver |
| PA | Power Amplifier |
| LUT | Look Up Table |
| SBTC | Symbol Based Trapping Compensation |
| DU | Digital Unit (BBU) |

What is claimed is:

1. A method for signal compensation, the method comprising:

generating a first processed signal at least partially based on smoothing, in real time, a digital input signal or a signal that is derived from the digital input signal; and determining one of multiple power ranges corresponding to the first processed signal;

generating a digital compensation signal at least partially based on the first processed signal and corresponding to a determined power range;

delaying the digital input signal such that the delayed digital input signal is aligned with the digital compensation signal in a time domain; and generating a digital compensated signal by combining the delayed digital input signal with the digital compensation signal.

2. The method of claim 1, wherein the step of generating a first processed signal at least partially based on smoothing, in real time, the digital input signal or the signal that is derived from the digital input signal comprises:

generating a first power signal from the digital input signal; and generating the first processed signal by smoothing the first power signal in real time.

3. The method of claim 1, wherein the step of generating a first processed signal at least partially based on smoothing, in real time, the digital input signal or the signal that is derived from the digital input signal comprises:

generating a smoothed signal by smoothing the digital input signal in real time; and generating, as the first processed signal, a first power signal from the smoothed signal.

4. The method of claim 3, wherein the first power signal is generated as follows:

$$\text{power}(k) = I^2(k) + Q^2(k)$$

where I(k) and Q(k) are in-phase and quadrature components of a $k^{th}$ sample of the digital input signal or the smoothed signal in an updating period, respectively.

5. The method of claim 1, wherein the smoothing is performed by a low pass filter that has a cut-off frequency such that a smoothed large signal can be distinguished from a smoothed small signal.

6. The method of claim 1, wherein the step of determining one of multiple power ranges corresponding to the first processed signal comprises:

comparing the first processed signal with one or more thresholds by which the multiple power ranges are defined; and determining the power range corresponding to the first processed signal based on a result of the comparison.

7. The method of claim 1, wherein the step of generating a digital compensation signal corresponding to the determined power range comprises:

using the determined power range as an index into a lookup table (LUT) to retrieve a corresponding entry from the LUT; and generating the digital compensation signal based on the retrieved corresponding entry.

8. The method of claim 7, wherein initial values of the entries of the LUT are 1.

9. The method of claim 1, wherein the step of generating a digital compensated signal by combining the delayed digital input signal with the digital compensation signal comprises:

generating the digital compensated signal by multiplying the delayed digital input signal with the digital compensation signal.

10. The method of claim 7, further comprising:

adaptively updating at least one value, from which at least one corresponding compensation signal is generated, based on one or more digital input signals and one or more corresponding digital compensated signals that are amplified.

11. The method of claim 10, wherein the one or more corresponding digital compensated signals that are amplified are one or more digital transmitter observation receiver (TOR) signals.

12. The method of claim 10, wherein the step of adaptively updating at least one value comprises:

selecting a set of digital input signals from the one or more digital input signals based on a flatness of each of the one or more digital input signals; and adaptively updating at least one value at least partially based on the set of the digital input signals, wherein a flatness of a signal indicates whether the signal has a change in power greater than or equal to a threshold or not.

13. The method of claim 12, wherein the step of selecting a set of digital input signals from the one or more digital input signals based on a flatness of each of the one or more digital input signals comprises:

selecting the set of the digital input signals by filtering out any digital input signal having a flatness greater than or equal to the threshold from the one or more digital input signals.

14. The method of claim 12, wherein the flatness is a peak-to-average-ratio (PAR) or a standard deviation of power of multiple samples of the digital input signal.

15. The method of claim 12, wherein the step of adaptively updating at least one value comprises:

aligning one or more digital input signals that are input during an updating period and their corresponding digital TOR signals in the time domain, respectively;

normalizing the one or more digital input signals and their corresponding digital TOR signals;

for each set of digital input signals that are input during the updating period and that are associated with a same power range, calculating an offset based on the corresponding set of digital input signals and the corresponding digital TOR signals that are aligned in the time domain and normalized;

for the each set of digital input signals that are input during the updating period and that are associated with the same power range, calculating a corresponding weight based on a corresponding offset; and updating the at least one value based on calculated weights.

16. The method of claim 15, wherein an offset is calculated as follows:

$$OST_{current}(\text{index}) = \sum_{k=0}^{L-1} \frac{|Tx(k)|^2}{\sum_{k=0}^{L-1} Tor(k).*conj(Tx(k))}$$

where index is the index of a corresponding entry of the LUT, $OST_{current}$ (index) is the offset for the corresponding entry in a current updating period, Tor(k) is a $k^{th}$ sample data of the digital TOR signal in the current updating period, Tx(k) is the $k^{th}$ sample data of the digital input signal in the current updating period, L is a number of sample data sampled in an updating period, ".*" is an operator for calculating a dot product of its operands, and conj(·) is an operator for calculating a conjugate of its operand.

17. A device for signal compensation, the device comprising:

a processor; and a memory having instructions stored thereon which, when executed by the processor, cause the processor to;

generating a first processed signal at least partially based on smoothing, in real time, a digital input signal or a signal that is derived from the digital input signal; and determining one of multiple power ranges corresponding to the first processed signal;

generating a digital compensation signal at least partially based on the first processed signal and corresponding to a determined power range;

delaying the digital input signal such that the delayed digital input signal is aligned with the digital compensation signal in a time domain; and generating a digital compensated signal by combining the delayed digital input signal with the digital compensation signal.

18. A power amplifier, comprising:

a processor; and a memory having instructions stored thereon which, when executed by the processor, cause the processor to:

generating a first processed signal at least partially based on smoothing, in real time, a digital input signal or a signal that is derived from the digital input signal; and determining one of multiple power ranges corresponding to the first processed signal;

generating a digital compensation signal at least partially based on the first processed signal and corresponding to a determined power range;

delaying the digital input signal such that the delayed digital input signal is aligned with the digital compensation signal in a time domain; and generating a digital compensated signal by combining the delayed digital input signal with the digital compensation signal;

a digital to RF converter configured to convert a digital compensated signal into a compensated RF signal; and a GaN power amplifier configured to amplify the compensated RF signal for radio transmission.

* * * * *